(12) United States Patent
Lee

(10) Patent No.: US 7,919,798 B2
(45) Date of Patent: Apr. 5, 2011

(54) IMAGE SENSOR AND FABRICATING METHOD THEREOF

(75) Inventor: Sun-Chan Lee, Changnyeong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 312 days.

(21) Appl. No.: 12/204,818

(22) Filed: Sep. 5, 2008

(65) Prior Publication Data

US 2009/0065821 A1 Mar. 12, 2009

(30) Foreign Application Priority Data

Sep. 7, 2007 (KR) .................... 10-2007-0090950

(51) Int. Cl.
*H01L 31/062* (2006.01)

(52) U.S. Cl. ........ 257/294; 257/291; 257/292; 257/293; 257/E27.133; 257/E27.134

(58) Field of Classification Search .......... 257/291–294, 257/E27.133, E27.134
See application file for complete search history.

(56) References Cited

U.S. PATENT DOCUMENTS

| 7,728,268 B2 * | 6/2010 | Sato et al. ................. 250/208.1 |
| 2005/0040317 A1 * | 2/2005 | Yaung ........................ 250/208.1 |
| 2006/0145211 A1 * | 7/2006 | Han ............................. 257/292 |
| 2006/0145219 A1 * | 7/2006 | Lim ............................. 257/294 |

FOREIGN PATENT DOCUMENTS

KR 10-2005-0059740 6/2005

* cited by examiner

*Primary Examiner* — N Drew Richards
*Assistant Examiner* — Yu-Hsi Sun
(74) *Attorney, Agent, or Firm* — Sherr & Vaughn, PLLC

(57) ABSTRACT

An image sensor and fabricating method thereof for preventing cross-talk between neighboring pixels by providing at least three light-shield walls combining to extend vertically above a lateral periphery of a photodiode for deflecting light from a microlens array towards the photodiode.

4 Claims, 4 Drawing Sheets

IMAGE SENSOR AND FABRICATING METHOD THEREOF

The present application claims priority under 35 U.S.C. §119 to Korean Patent Application No. 10-2007-0090950 (filed on Sep. 7, 2007), which is hereby incorporated by reference in its entirety.

BACKGROUND

In image sensors such as CMOS image sensors, cross-talk may be generated between pixels. Specifically, optical cross-talk is generated if light enters a neighboring pixel adjacent to a target pixel by being transmitted through a dielectric layer between metal lines. In such an instance, a photodiode obtains improper information, and thus, outputs an incorrect image. In particular, cross-talk mixes data together to cause color mixing. In case of photographing a bright image, creation of a bright background thereby results.

Figure 1:
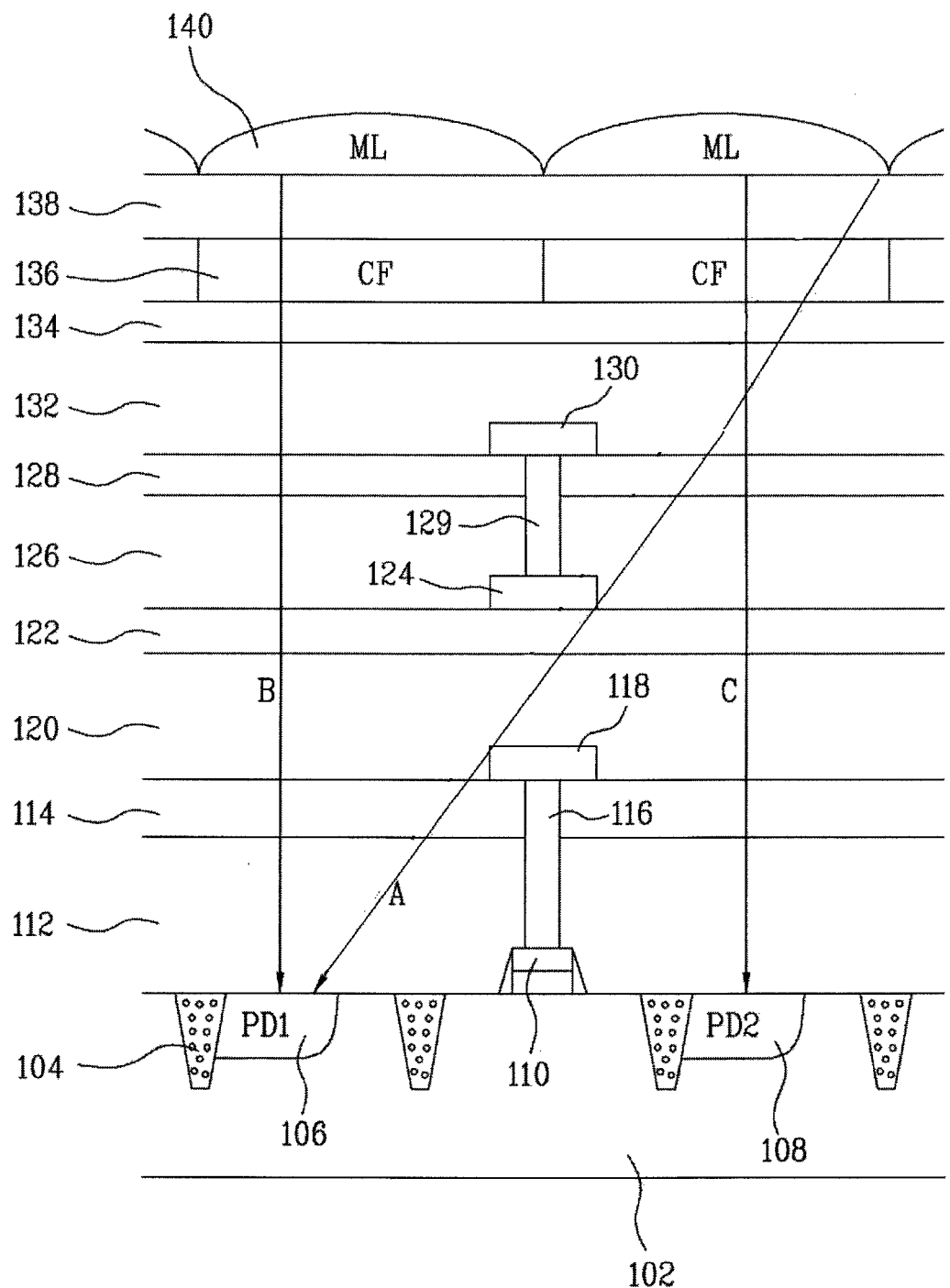

Example FIG. 1 illustrates a cross-sectional diagram of an image sensor in which light is transmitted through a microlens and enters a neighboring pixel instead of a target pixel. A lower structure of such an image sensor may include shallow trench isolation (STI) film 104, a plurality of photodiodes and transistors provided at predetermined locations in pixel and peripheral areas on and/or over semiconductor substrate 102.

As illustrated in example FIG. 1, an image sensor may include first photodiode 106, second photodiode 108 and gate electrode 110 of a transistor. By way of example, example FIG. 1 shows a pair of photodiodes and a single gate electrode 110 indicating a transistor, and other photodiodes and transistors are omitted in order to simplify the illustration of example FIG. 1. Boro-phosphor-silicate glass layer (BPSG) 112 serving as a pre-metal dielectric (PMD) layer and first capping layer 114 are formed on and/or over the lower structure of the image sensor. BPSG layer 112 and first capping layer 114 are then patterned, contact 116 for an upper line structure is formed, and first metal line 118 is then formed on and/or over capping layer 114. Subsequently, first interlayer dielectric (ILD) layer 120 and second capping layer 122 are stacked on and/or over first metal line 118 and first capping layer 114.

Second metal line 124 is formed on and/or over second capping layer 122 and second ILD layer 126 and third capping layer 128 are then stacked on and/or over second metal line 124 and second capping layer 122. Subsequently, second ILD layer 126 and third capping layer 128 are patterned to form via 129 and third metal line 130 is then formed on and/or over third capping layer 128. Third metal line 130 is electrically connected to second metal line 124 by way of via 129 despite that third metal line 130 and second metal line 124 exist on different layers, respectively. After forming undoped silicate glass (USG) layer 132 on and/or over third capping layer 128 and third metal line 130, nitride layer 134 is stacked thereon. Subsequently, color filter layer 136, planarization layer 138 and microlens array 140 are sequentially formed on and/or over nitride layer 134. Hence, an image sensor having a three metal structure is completed.

As illustrated in example FIG. 1, optical paths A, B and C are explained as follows. Each optical path B and C indicates that light transmitted through microlens array 140 enters a corresponding diode. However, optical path A indicates that light passing through insulator between metal lines enters first photodiode 106 adjacent to second photodiode 108 that is a target diode. Consequently, optical cross-talk is generated. Light passing through microlens array 140 may enter an unexpected photodiode by being reflected and/or refracted on various metal wires and/or interlayer layers, thereby causing cross-talk.

SUMMARY

Embodiments relate to an image sensor such as a CMOS image sensor and fabricating method thereof that is suitable for a wide scope of applications.

Embodiments relate to an image sensor such as a CMOS image sensor and fabricating method thereof that is particularly suitable for preventing cross-talk between neighboring pixels.

Embodiments relate to a method of fabricating an image sensor that may include at least one of the following steps: forming transistors on and/or over pixel and periphery areas of a semiconductor substrate; and then forming a photodiode adjacent to a respective transistor in the pixel area; and then forming a metal insulating layer and a plurality of insulating interlayers on and/or over the entire semiconductor substrate; and then forming a contact by patterning the metal insulating layer and the plurality of insulating interlayers and then filling a metal material and also forming a plurality of light-shield contacts on and/or over the pixel area to expose the photodiode; and then forming a plurality of metal lines between the plurality of insulating interlayers and also forming a plurality of light-shield metal layers on and/or over the pixel area to expose the photodiode.

Embodiments relate to an image sensor that may include at least one of the following: a semiconductor substrate having pixel and periphery areas defined thereon; transistors formed on and/or over the pixel and periphery areas; a photodiode formed adjacent to a respective transistor in the pixel area; a metal insulating layer and a plurality of insulating interlayers formed on and/or over the entire semiconductor substrate; a contact formed in the insulating interlayers; a plurality of light-shield contacts formed the entire semiconductor substrate the pixel area to expose the photodiode; a plurality of metal lines formed between the insulating interlayers; and a plurality of light-shield metal layers formed the entire semiconductor substrate the pixel area to expose the photodiode.

Embodiments relate to a method that may include at least one of the following steps: providing a semiconductor substrate having at least one shallow trench isolation film and at least one photodiode formed therein and a gate electrode formed thereon; and then forming a dielectric layer over the entire semiconductor substrate including the gate electrode, the at least one shallow trench isolation film and the at least one photodiodes; and then simultaneously forming a contact extending through the dielectric layer and electrically connected to the gate electrode and at least one light shield contact extending through the dielectric layer and contacting the at least one shallow trench isolation film; and then simultaneously forming a metal line over the dielectric layer and contacting the contact and at least one light-shield layer formed over the dielectric layer and contacting the at least one light shield contact; and then forming a color filter array over the entire semiconductor substrate including the dielectric layer, the metal line and the at least one light-shield layer; and then forming a microlens array over the color filter array. In accordance with embodiments, the at least one light shield contact and the at least one light-shield layer combine to form a primary light-shield wall for deflecting light from the microlens array towards the at least one photodiode.

Accordingly, in accordance with embodiments, a light-shield metal wall is formed on a periphery of a photodiode to condense light on a target photodiode by cutting off or otherwise reflecting the incident light transmitted through a microlens, thereby preventing cross-talk with a neighboring pixel.

DRAWINGS

Example FIG. 1 illustrates a cross-sectional diagram of an image sensor.

Figure 2A:
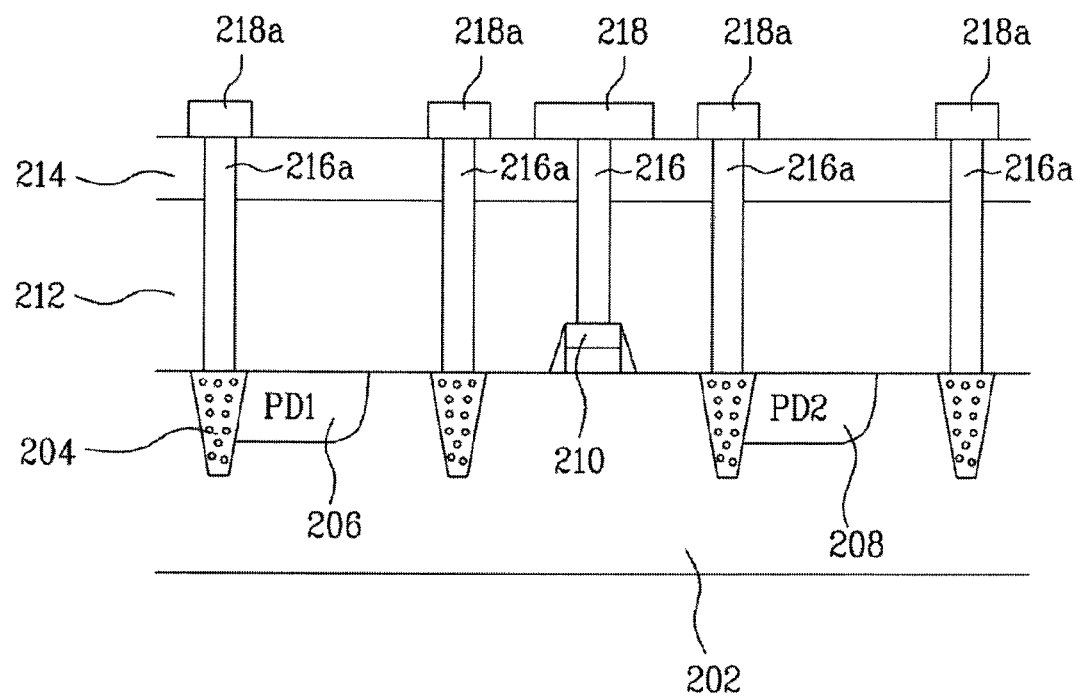
Figure 2B:
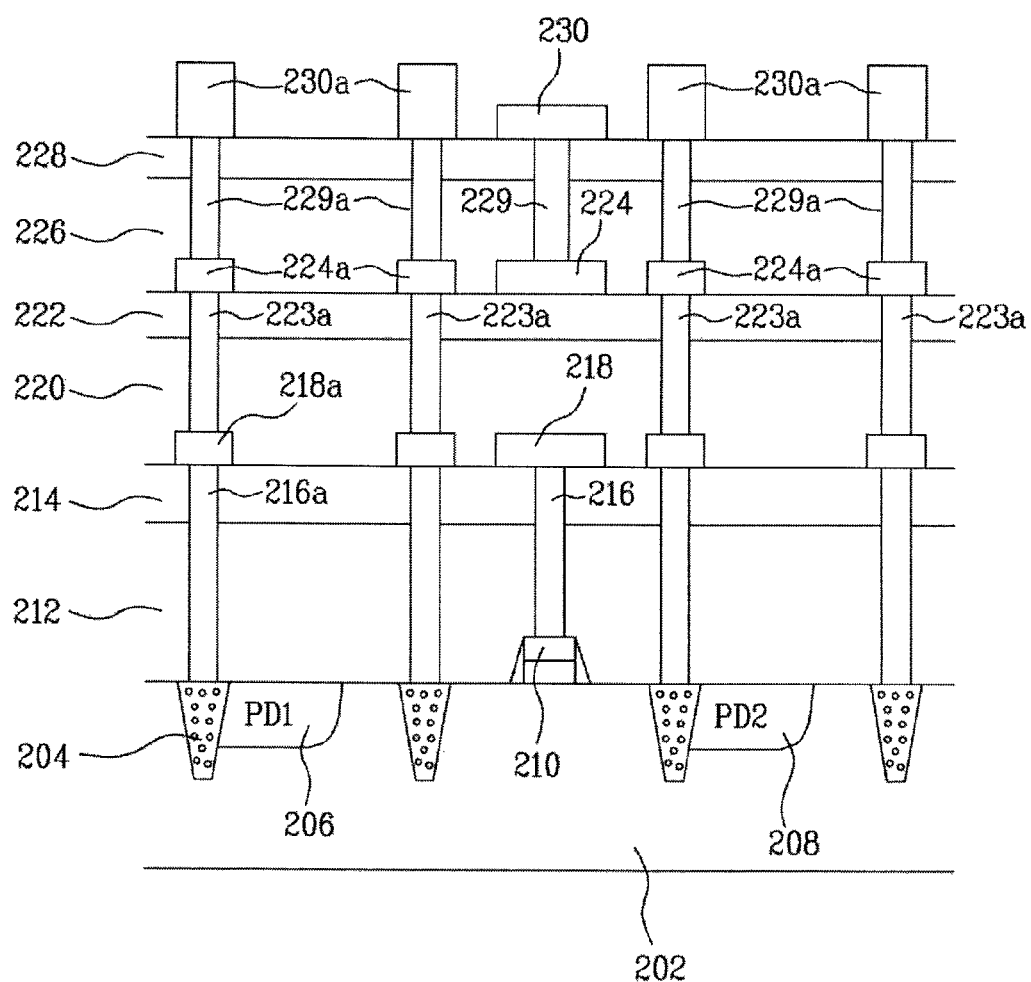
Figure 2C:
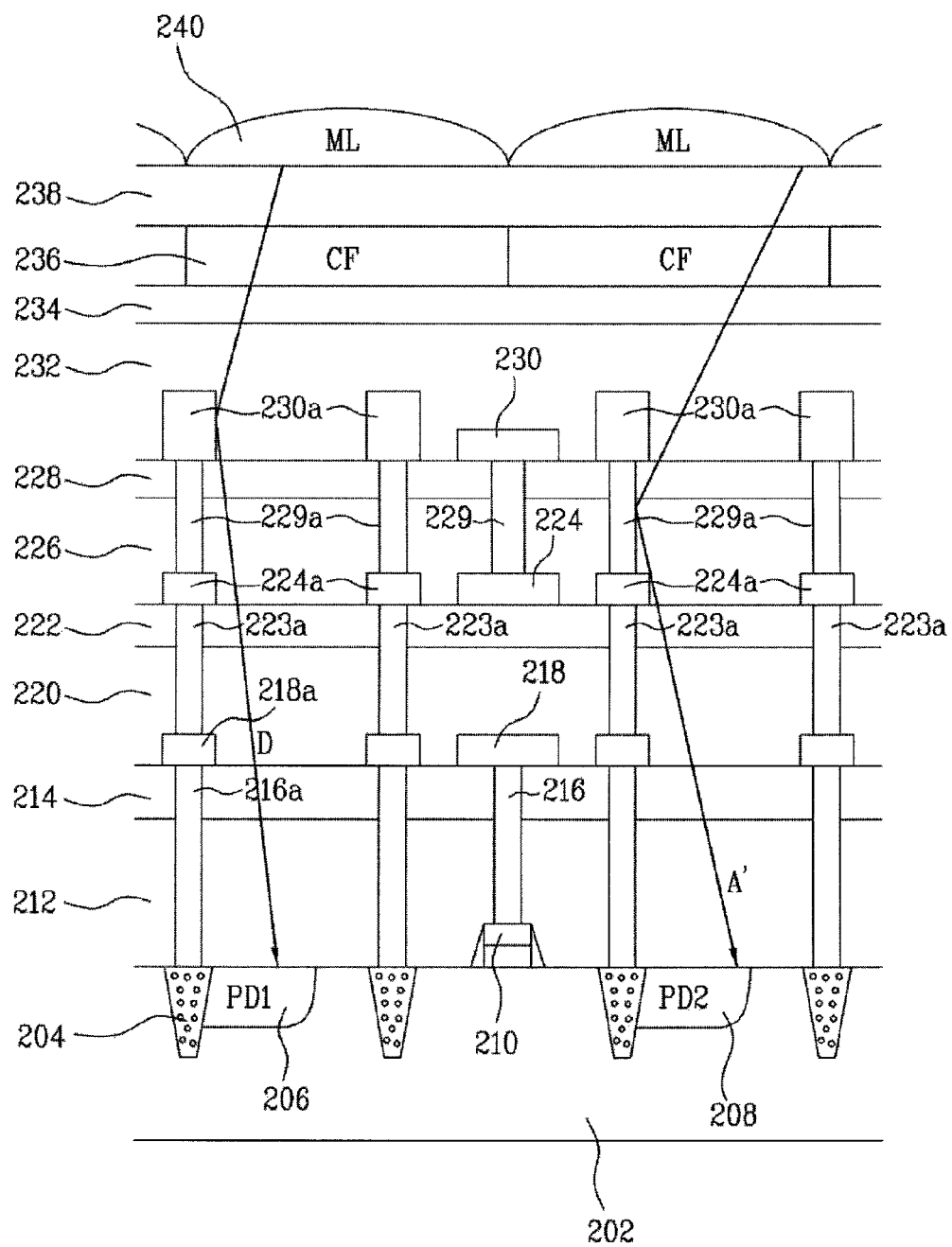

Example FIGS. 2A to 2C illustrate a method of fabricating an image sensor for preventing cross-talk in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

Example FIGS. 2A to 2C are cross-sectional diagrams for a method of fabricating an image sensor for preventing cross-talk in accordance with embodiments, in which a cross-section of a 3-metal image sensor is illustrated per process step.

As illustrated in example FIG. 2A, a lower structure of an image sensor in accordance with embodiments may include shallow trench isolation (STI) film 204, photodiodes and transistors provided on and/or over predetermined locations in pixel and peripheral areas of semiconductor substrate 202. First photodiode 206 and second photodiode 208 are formed in semiconductor substrate 202 adjacent to a respective STI film 204. Gate electrode 210 is formed on and/or over semiconductor substrate 202. Embodiments illustrated in example FIGS. 2A to 2C illustrate a pair of photodiodes and a single gate electrode indicating a transistor to simplify the corresponding drawing, and thus, are not limited thereto. For instance, other photodiodes and transistors are omitted to simplify the corresponding example drawings. BPSG layer 212 serving as a PMD (pre-metal dielectric) layer and first capping layer 214 are sequentially formed on and/or over the entire semiconductor substrate 202 including gate electrode 210 and photodiodes 206, 208. First capping layer 214 can be formed of silane ($SiH_4$). BPSG layer 212 and first capping layer 214 may then be patterned to form a plurality of contact holes exposing gate electrode 210 and STI film 204.

Contact 216 for establishing electrical connection between the lower structure and an upper line structure is then formed by filling the contact hole with a metallic material. Contact 216 is formed on and/or over and contacting gate electrode 210. During the formation of contact 216, light-shield contacts 216a are formed in a manner of laterally enclosing the peripheries of first photodiode 206 and second photodiode 208 but not existing directly on the exposed areas of first photodiode 206 and second photodiode 208. Light-shield contacts 216 a may be formed on and/or over and contacting a respective STI film 204. First metal lines 218 are then formed on and/or over first capping layer 214 and in contact with contact 216. During formation of first metal line 218, first light-shield metal layers 218a may be formed in a manner of laterally enclosing the peripheries of first photodiode 206 and second photodiode 208 but not existing directly on exposed areas of first photodiode 206 and second photodiode 208. First light-shield layer 218a and light-shield contact 216a are connected together or may be aligned in substantially a straight line in a direction substantially vertical to the lateral uppermost surface of semiconductor substrate 202 to thereby combine to form a primary light-shield metal wall.

As illustrated in example FIG. 2B, first ILD layer 220 and second capping layer 222 may then be sequentially stacked on and/or over first metal line 218, first capping layer 214 and first light-shield metal layers 218a. Second capping layer 222 can be formed of the same material as first capping layer 214, i.e., silane ($SiH_4$). Subsequently, a plurality of contact holes are formed extending through first ILD layer 220 and second capping layer 222 to expose first metal line 218 and first light-shield metal layers 218a. Such contact holes may be formed by patterning first ILD layer 220 and second capping layer 222. First light-shield vias 223a may then be formed by filling the contact holes with a metallic material. First light-shield via 223 can be formed in a manner of further laterally enclosing peripheries of first and second photodiodes 206 and 208 but not existing directly on exposed areas of first photodiode 206 and second photodiode 208. Second metal line 224 is formed on the second capping layer 222. During formation of second metal line 224, second light-shield metal layer 224a may also be formed in a manner of further laterally enclosing peripheries of first and second photodiodes 206 and 208 but not existing directly on exposed areas of first photodiode 206 and second photodiode 208. Second light-shield metal layer 224a and first light-shield via 223a are connected together or may be aligned in substantially a straight line in a direction substantially vertical to the lateral uppermost surface of semiconductor substrate 202 to thereby combine to form a secondary light-shield metal wall.

Second ILD layer 226 and third capping layer 228 may then be sequentially stacked on and/or over second metal line 224, second light-shield metal layer 224a and second capping layer 222. Third capping layer 228 can be formed of the same material as first capping layer 214 and second capping layer 222, i.e., silane ($SiH_4$). Subsequently, second ILD layer 226 and third capping layer 228 are patterned to form first via 229 and third metal line 230 is then formed on and/or over third capping layer 228 and contacting first via 229. Third metal line 230 is electrically connected to second metal line 224 through first via 229 despite that third metal line 230 and second metal line 224 exist on different layers, respectively. During formation of first via 229, contact holes are formed by patterning second ILD layer 226 and third capping layer 228. Second light-shield via 229a may then be formed by filling the contact holes with a metallic material. During formation of third metal line 230, third light-shield metal layer 230a is formed. Third light-shield metal layer 230a and second light-shield via 229a can be formed in a manner of further laterally enclosing peripheries of first and second photodiodes 206 and 208 but not existing directly on exposed areas of first photodiode 206 and second photodiode 208. Third light-shield metal layer 230a and second light-shield via 229a are connected together or may be aligned in substantially a straight line in a direction substantially vertical to the lateral uppermost surface of semiconductor substrate 202 to thereby combine to form a tertiary light-shield metal wall.

First light-shield metal layer 218a, light-shield contact 216a, second light-shield metal layer 224a, first light-shield via 223a, second light-shield via 229a and third light-shield metal layer 230a spatially form substantially a straight line vertically with respect to the lateral uppermost surface of semiconductor substrate 202 to configure a multi-level light-shield metal wall. First light-shield metal layer 218a, light-shield contact 216a, second light-shield metal layer 224a, first light-shield via 223a, second light-shield via 229a and third light-shield metal layer 230a can be formed of a metal such as at least one of tungsten (W) and aluminum (Al). In accordance with embodiments, light-shield contact 216a and light-shield vias 223a and 229a may be formed of a metallic material having good gap-fill properties, such as tungsten (W) while light-shield metal layers 218a, 224a and 230a may be formed of a metallic material having good conductivity, such as aluminum (Al). The final light-shield metal wall can be configured in a manner that the light-shield metal wall of each layer is not short-circuited with a metal line on the same layer.

In the image sensor in accordance with embodiments, various functions are operated by electric signals applied to metal lines on three layers in the 3-metal structure. Hence, the configuration of the final light-shield metal wall does not interrupt the operations of the various functions. In case that the light-shield metal wall is possible to be short-circuited with a metal line, contact or via on a path of the signal, the light-shield metal wall may not be formed on the corresponding layer (not shown in the drawing). In such a case, third light-shield metal layers 230a can be formed spatially higher than third metal line 230. This may serve to expand a light-shield range by raising the spatial height of the final light-shield metal wall.

As illustrated in example FIG. 2C, USG layer 232 may then be formed on and/or over third capping layer 228, third metal line 230 and third light-shield metal layer 230a. Nitride layer 234 may then be stacked on and/or over USG layer 232. Subsequently, color filter layer array 236, planarization layer 238 and microlens array 240 may then be sequentially formed on and/or over nitride layer 234, thereby completing an image sensor having a three metal layer structure. Importantly, optical paths A' indicates that light passing through microlens 240 is condensed on second photodiode 208 as a target by being reflected by second light-shield via 229a which serves as a portion of the final light-shield metal wall. When compared to optical path A illustrated in example FIG. 1, it can be seen that optical path A' reduces or otherwise eliminates optical cross-talk. Optical path D indicates that light reflected by an upper portion of third light-shield metal layer 230a is condensed on first photodiode 206 as a target. Therefore, by cutting off the passing light using the insulator provided between the metal line, contact and via which configure the signal path of the image sensor, it is able to eliminate optical cross-talk.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate having pixel and periphery areas defined thereon;
   transistors formed on the pixel and periphery areas;
   a photodiode formed in the pixel area adjacent to a respective one of the transistors;
   a plurality of insulating layers formed over the entire semiconductor substrate including the photodiodes and transistors;
   a contact formed in a lower one of the insulating layers and in electrical contact with a respective transistor;
   a plurality of light-shield contacts formed over the pixel area for deflecting light towards a respective photodiode;
   a plurality of metal lines formed in a respective one of the insulating layers; and
   a plurality of light-shield metal layers formed over the pixel area to deflect light towards a respective photodiode,
   wherein an uppermost one of the light-shield metal layers has a greater thickness than that of a respective metal line formed on the same layer,
   wherein the light-shield contacts and the light-shield metal layers are formed to directly contact each other and thereby form a straight line in a vertical direction relative to the uppermost lateral surface of the semiconductor substrate.

2. The image sensor of claim 1, wherein the light-shield contacts and the light-shield metal layers are configured to laterally enclose a periphery of a respective photodiode to prevent a short circuit with a respective metal line on the same layer of the light-shield metal layer.

3. The image sensor of claim 1, wherein the light-shield contacts and the light-shield metal layers are formed of one of tungsten and aluminum.

4. The image sensor of claim 1, further comprising: a color filter layer array formed over the entire semiconductor substrate including the light-shield contacts, the metal lines and the light-shield metal layers; a planarization layer formed over the color filter layer array; and a microlens array formed over the planarization layer.

* * * * *